(12) United States Patent
Takayama et al.

(10) Patent No.: US 12,046,533 B2
(45) Date of Patent: Jul. 23, 2024

(54) SEMICONDUCTOR DEVICE

(71) Applicant: Mitsubishi Electric Corporation, Tokyo (JP)

(72) Inventors: Tsuyoshi Takayama, Tokyo (JP); Takaaki Shirasawa, Tokyo (JP); Mitsunori Aiko, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 318 days.

(21) Appl. No.: 17/441,913

(22) PCT Filed: Jun. 25, 2019

(86) PCT No.: PCT/JP2019/025162
§ 371 (c)(1),
(2) Date: Sep. 22, 2021

(87) PCT Pub. No.: WO2020/261382
PCT Pub. Date: Dec. 30, 2020

(65) Prior Publication Data
US 2022/0189851 A1     Jun. 16, 2022

(51) Int. Cl.
*H01L 23/40* (2006.01)
*H01L 23/31* (2006.01)
(Continued)

(52) U.S. Cl.
CPC ...... *H01L 23/4006* (2013.01); *H01L 23/3107* (2013.01); *H01L 23/047* (2013.01);
(Continued)

(58) Field of Classification Search
CPC ............. H01L 23/4006; H01L 23/3107; H01L 2023/4087; H01L 2023/4081; H01L 2924/1815; H01L 23/047; H01L 25/115
See application file for complete search history.

(56) References Cited

U.S. PATENT DOCUMENTS 6,566,879 B1 * 5/2003 Vanek ................ G01R 33/3852
324/318
9,196,566 B2 * 11/2015 Komatsu ............... H01L 21/565
(Continued)

FOREIGN PATENT DOCUMENTS

JP      2000-058726 A     2/2000
JP      2002-235723 A     8/2002
(Continued)

OTHER PUBLICATIONS

International Search Report issued in PCT/JP2019/025162; mailed Aug. 27, 2019.
(Continued)

*Primary Examiner* — David Vu
*Assistant Examiner* — Brandon C Fox
(74) *Attorney, Agent, or Firm* — Studebaker & Brackett PC

(57) ABSTRACT

It is an object to provide a technique allowing for suppression of the height of a protrusion from the surface of a semiconductor module. A semiconductor device includes: a semiconductor module having a first groove; a Belleville washer having a recess in an outer surface and a protrusion on an inner surface; and a screw passing through the hole of the Belleville washer and the first groove of the semiconductor module to fasten the semiconductor module and an attached body. A head of the screw is accommodated in the recess of the Belleville washer, and at least portion of the protrusion of the Belleville washer is accommodated in the first groove of the semiconductor module.

19 Claims, 17 Drawing Sheets

(51) Int. Cl.
*H01L 23/047* (2006.01)
*H01L 25/11* (2006.01)

(52) U.S. Cl.
CPC .............. *H01L 2023/4081* (2013.01); *H01L 2023/4087* (2013.01); *H01L 25/115* (2013.01); *H01L 2924/1815* (2013.01)

(56) References Cited

U.S. PATENT DOCUMENTS

| | | | | |
|---|---|---|---|---|
| 2013/0308275 | A1* | 11/2013 | Yamanaka | H05K 7/209 361/717 |
| 2014/0374896 | A1* | 12/2014 | Nishida | H01L 23/4006 438/122 |
| 2015/0292542 | A1* | 10/2015 | Tapata | F16B 25/103 411/337 |
| 2017/0282236 | A1* | 10/2017 | Hutter, III | C22C 38/50 |
| 2023/0187311 | A1* | 6/2023 | Hori | H01L 24/32 257/712 |

FOREIGN PATENT DOCUMENTS

| | | | | |
|---|---|---|---|---|
| JP | 2005-286130 | A | 10/2005 | |
| JP | 2011-035265 | A | 2/2011 | |
| JP | 2012-028703 | A | 2/2012 | |
| JP | 2012-222069 | A | 11/2012 | |
| JP | 2013120756 | A * | 6/2013 | ............ H01L 24/33 |
| JP | 2014-033119 | A | 2/2014 | |
| JP | 2014-053440 | A | 3/2014 | |
| JP | 2014-112737 | A | 6/2014 | |

OTHER PUBLICATIONS

An Office Action; "Notice of Reasons for Refusal", mailed by the Japanese Patent Office on May 10, 2022, which corresponds to Japanese Patent Application No. 2021-528702 and is related to U.S. Appl. No. 17/441,913 with English language translation.

An Office Action mailed by China National Intellectual Property Administration on Apr. 29, 2024, which corresponds to Chinese Patent Application No. 201980097696.5 and is related to U.S. Appl. No. 17/441,913; with English language translation.

* cited by examiner

F I G. 2
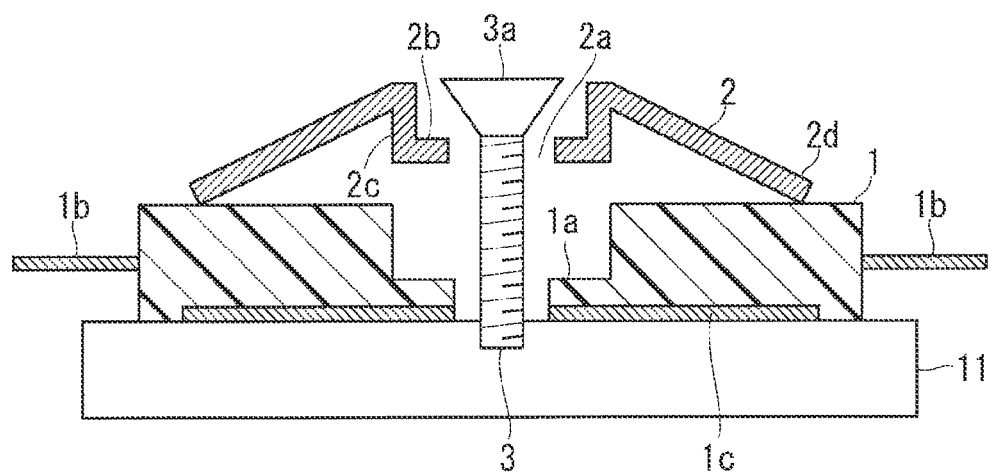

F I G. 6
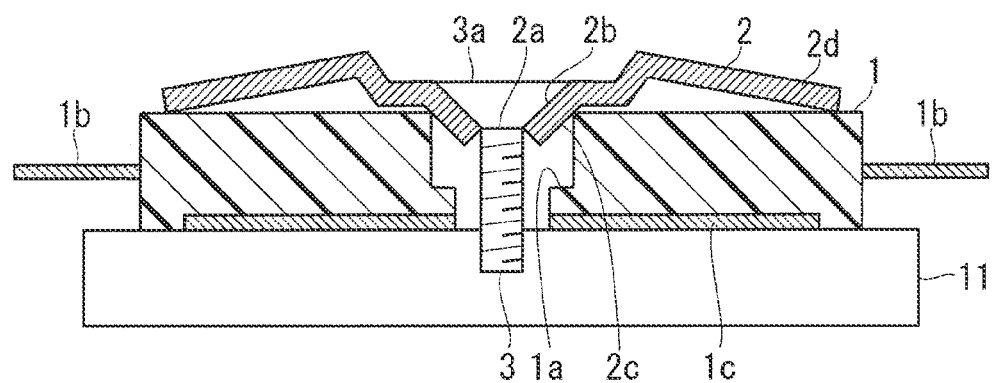

F I G. 9
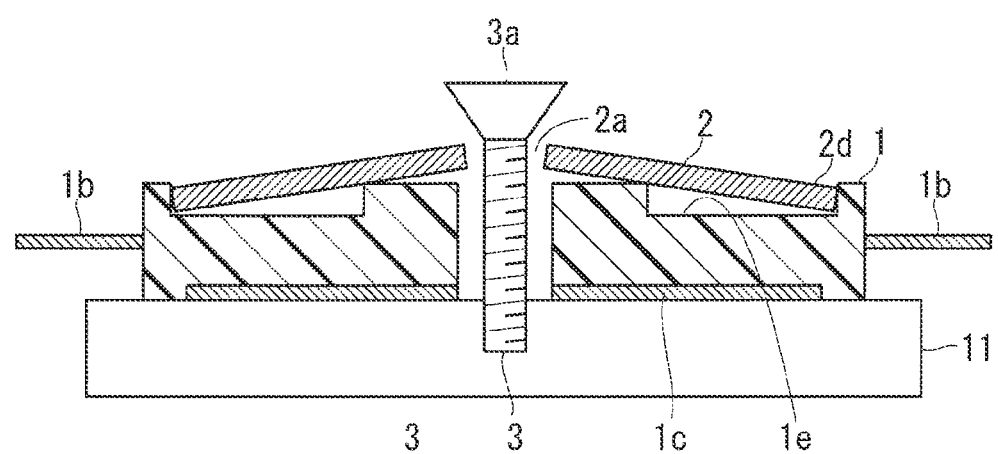

F I G. 1 4
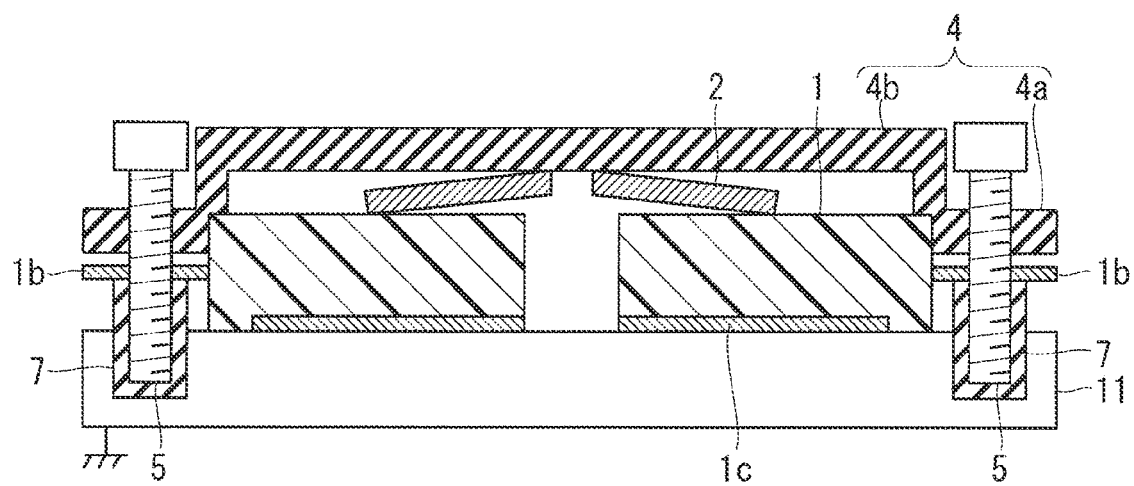

SEMICONDUCTOR DEVICE

TECHNICAL FIELD

The present invention relates to a semiconductor device including a semiconductor module attached to an attached body.

BACKGROUND ART

Various techniques have been proposed for a semiconductor device including a semiconductor module attached to an attached body. For example, Patent Document 1 proposes a technique of fastening a semiconductor module and an attached body with a screw via a Belleville washer having a hollow substantially frusto-conical shape to attach the semiconductor module to the attached body. According to such a technique, stress caused by fastening with the screw can be distributed by the Belleville washer, so that the semiconductor module can stably be attached to the attached body.

PRIOR ART DOCUMENT

Patent Document

Patent Document 1: Japanese Patent Application Laid-Open No. 2011-35265

SUMMARY

Problem to be Solved by the Invention

In a technique as described above, however, a head of the screw and the Belleville washer protrude from the surface of the semiconductor module by the thickness thereof. Such a protrusion of the head of the screw, the Belleville washer, and the like from the surface of the semiconductor module sometimes obstructs appropriate attachment of a control substrate and the like to the surface of the semiconductor module, for example.

The present invention has been conceived in view of a problem as described above, and it is an object to provide a technique allowing for suppression of the height of a protrusion from the surface of a semiconductor module.

Means to Solve the Problem

A semiconductor device according to the present invention includes: a semiconductor module having a first groove; a Belleville washer whose hole and a periphery of the hole are recessed to have a recess in an outer surface and a protrusion on an inner surface; and a screw passing through the hole of the Belleville washer and the first groove of the semiconductor module to fasten the semiconductor module and an attached body, wherein a head of the screw is accommodated in the recess of the Belleville washer, and at least portion of the protrusion of the Belleville washer is accommodated in the first groove of the semiconductor module.

Effects of the Invention

According to the present invention, the head of the screw is accommodated in the recess of the Belleville washer, and at least portion of the protrusion of the Belleville washer is accommodated in the first groove of the semiconductor module, so that the height of a protrusion from the surface of the semiconductor module can be suppressed.

The objects, features, aspects, and advantages of the present invention will become more apparent from the following detailed description and the accompanying drawings.

BRIEF DESCRIPTION OF DRAWINGS

FIG. 2 is a cross-sectional view illustrating a configuration of a semiconductor device according to Modification 1 of Embodiment 1.

FIG. 6 is a cross-sectional view illustrating a configuration of the semiconductor device according to Modification 4 of Embodiment 1.

FIG. 9 is a cross-sectional view illustrating a configuration of a semiconductor device according to Embodiment 2.

FIG. 14 is a cross-sectional view illustrating a configuration of a semiconductor device according to Modification 1 of Embodiment 4.

DESCRIPTION OF EMBODIMENTS

Embodiment 1

Figure 1:
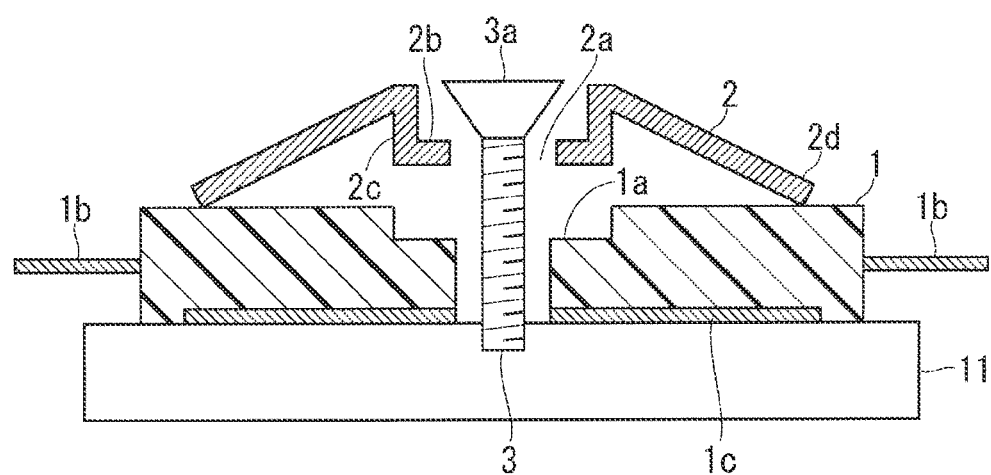
FIG. 1 is a cross-sectional view illustrating a configuration of a semiconductor device according to Embodiment 1.

FIG. 1 is a cross-sectional view illustrating a configuration of a semiconductor device according to Embodiment 1 of the present invention. The semiconductor device in FIG. 1 includes a semiconductor module 1, a Belleville washer 2, and a screw 3, and the semiconductor module 1 is attached to a cooling unit 11 being an attached body with the screw 3. The cooling unit 11 is, for example, a cooling fin.

The semiconductor module 1 has a first groove 1a in a surface opposite a surface to be in contact with the cooling unit 11. The semiconductor module 1 includes a semiconductor element, such a metal oxide semiconductor field effect transistor (MOSFET), an insulated gate bipolar transistor (IGBT), a Schottky barrier diode (SBD), and a PN junction diode (PND), which is not illustrated, and a resin member to cover the semiconductor element. The semiconductor module 1 has generally the same shape as the resin member of the semiconductor module 1, so that the semiconductor module 1 having the first groove 1a means that the resin member has the first groove 1a.

The semiconductor module 1 according to Embodiment 1 also includes an electrode terminal 1b protruding laterally and a heat transfer body 1c disposed in the surface to be in contact with the cooling unit 11.

As with a typical Belleville washer, the Belleville washer 2 has a hollow substantially frusto-conical shape, and has a hole 2a at the center thereof. The hole 2a and the periphery of the hole 2a of the Belleville washer 2 are recessed in the same direction (a downward direction in FIG. 1) as a direction of displacement of an outer periphery 2d of the Belleville washer 2 from the center of the Belleville washer 2. This allows the Belleville washer 2 to have a recess 2b in an outer surface (upper surface in FIG. 1) and a protrusion 2c on an inner surface (a lower surface in FIG. 1).

The screw 3 passes through the hole 2a of the Belleville washer 2 and the first groove 1a of the semiconductor module 1 to fasten the semiconductor module 1 and the cooling unit 11. The outer periphery 2d of the Belleville washer 2 is resiliently movable with respect to the center of the Belleville washer 2 in a direction of the height of the substantially frusto-conical shape. The Belleville washer 2 having such a configuration can distribute stress from the screw 3 to the semiconductor module 1 caused by fastening with the screw 3, and allows for pressing of a relatively wide range of the semiconductor module 1. The semiconductor module 1 can thus stably be attached to the cooling unit 11.

In the semiconductor device according to Embodiment 1, a head 3a of the screw 3 is accommodated in the recess 2b of the Belleville washer 2, and at least portion of the protrusion 2c of the Belleville washer 2 is accommodated in the first groove 1a of the semiconductor module 1. According to such a configuration, the height of a protrusion of the head 3a of the screw 3, the Belleville washer 2, and the like from the surface of the semiconductor module 1 can be suppressed. Furthermore, recessing the Belleville washer 2 can suppress inversion of the Belleville washer 2.

Modification 1 of Embodiment 1

In Embodiment 1, the first groove 1a of the semiconductor module 1 may have a depth equal to or greater than the height of the protrusion 2c of the Belleville washer 2 as illustrated in FIG. 2. According to such a configuration, the protrusion 2c of the Belleville washer 2 as a whole can substantially be accommodated in the first groove 1a, so that the height of the protrusion from the surface of the semiconductor module 1 can be suppressed.

Modification 2 of Embodiment 1

Figure 3:
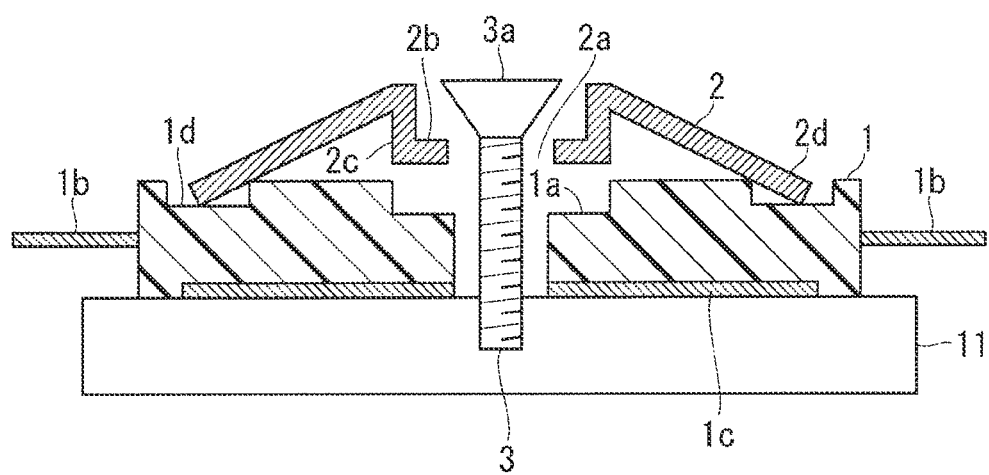
FIG. 3 is a cross-sectional view illustrating a configuration of a semiconductor device according to Modification 2 of Embodiment 1.

In Embodiment 1, the semiconductor module 1 may further have a second groove 1d to accommodate the outer periphery 2d of the Belleville washer 2 as illustrated in FIG. 3. According to such a configuration, the Belleville washer 2 as a whole can substantially be brought closer to the semiconductor module 1, so that the height of the protrusion from the surface of the semiconductor module 1 can be suppressed. Furthermore, stress to the Belleville washer 2 can be reduced to suppress inversion of the Belleville washer 2.

Modification 3 of Embodiment 1

Figure 4:
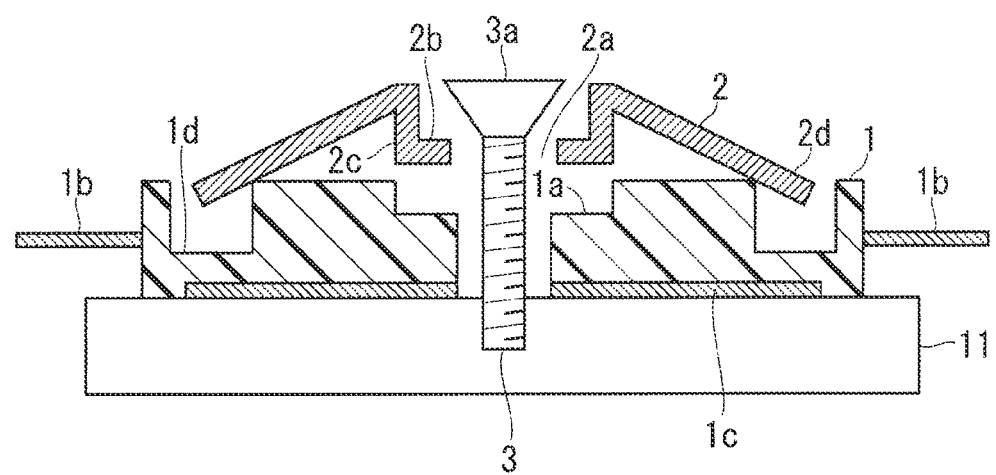
FIG. 4 is a cross-sectional view illustrating a configuration of a semiconductor device according to Modification 3 of Embodiment 1.

In Modification 2 of Embodiment 1, the first groove 1a and the second groove 1d may have different depths as long as the outer periphery 2d of the Belleville washer 2 can press the semiconductor module 1 as illustrated in FIG. 4. According to such a configuration, a relatively wide range of the semiconductor module 1 can be pressed with the Belleville washer 2 while the height of the protrusion from the surface of the semiconductor module 1 is suppressed.

Modification 4 of Embodiment 1

Figure 5:
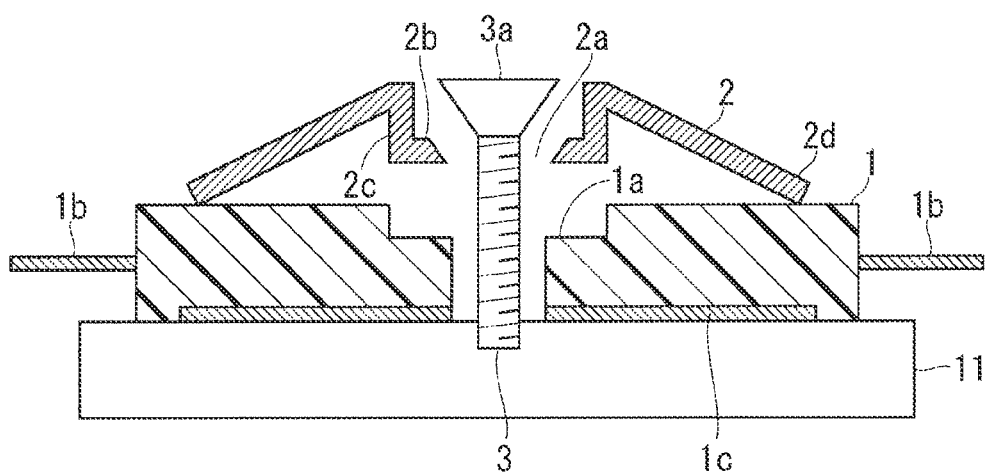
FIG. 5 is a cross-sectional view illustrating a configuration of a semiconductor device according to Modification 4 of Embodiment 1.

In Embodiment 1, the hole 2a of the Belleville washer 2 may correspond in cross-sectional shape to at least portion of the head 3a of the screw 3 as illustrated in FIGS. 5 and 6. The hole 2a of the Belleville washer 2 corresponds in cross-sectional shape to a portion of the head 3a of the screw 3 in FIG. 5, and corresponds in cross-sectional shape to the head 3a of the screw 3 as a whole in FIG. 6.

Figure 7:
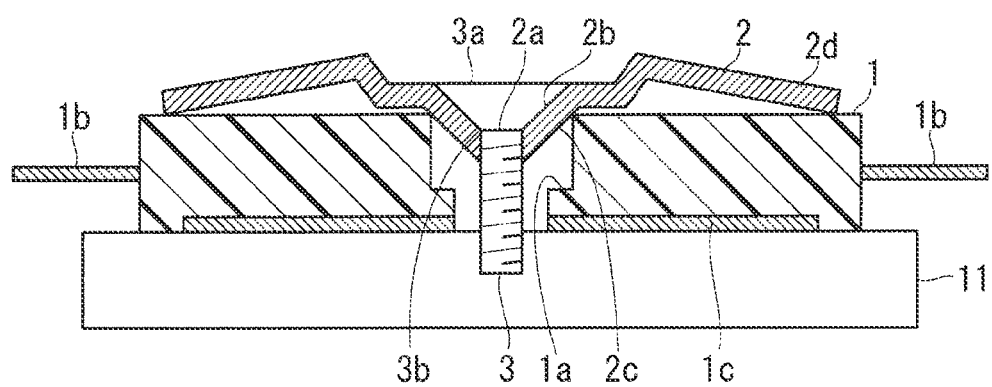
FIG. 7 is a cross-sectional view illustrating a configuration of the semiconductor device according to Modification 4 of Embodiment 1.

In Embodiment 1, the hole 2a of the Belleville washer 2 may correspond in cross-sectional shape to the head 3a of the screw 3 as a whole and a root 3b of the head 3a of the screw 3 as illustrated in FIG. 7 in place of the configuration illustrated in FIGS. 5 and 6. According to a configuration as described above, a swing of the Belleville washer 2 with respect to the screw 3 can be suppressed while the height of the protrusion from the surface of the semiconductor module 1 is suppressed.

Modification 5 of Embodiment 1

Figure 8:
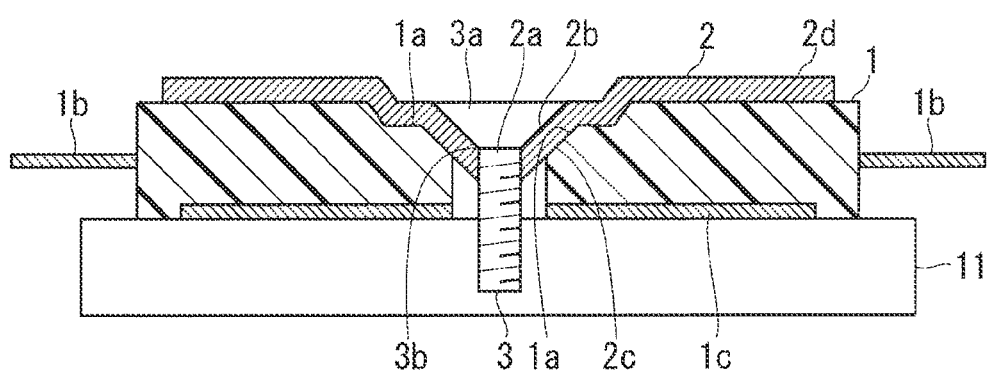
FIG. 8 is a cross-sectional view illustrating a configuration of a semiconductor device according to Modification 5 of Embodiment 1.

In Embodiment 1, the first groove 1a of the semiconductor module 1 may correspond in cross-sectional shape to at least portion of the protrusion 2c of the Belleville washer 2 as illustrated in FIG. 8. A cross-sectional shape of the first groove 1a of the semiconductor module 1 may include a tapered shape. According to such a configuration, a relatively wide range of the semiconductor module 1 can be pressed while the height of the protrusion from the surface of the semiconductor module 1 is suppressed.

Embodiment 2

FIG. 9 is a cross-sectional view illustrating a configuration of a semiconductor device according to Embodiment 2 of the present invention. In the following description, components according to Embodiment 2 that are the same as or similar to the above-mentioned components bear reference signs that are the same as or similar to those of the above-mentioned components, and description will be made mainly on different components.

In Embodiment 2, the Belleville washer 2 is a typical Belleville washer, and does not have the recess 2b and the protrusion 2c in FIG. 1. The screw 3 passes through the hole 2a of the Belleville washer 2 to fasten the semiconductor module 1 and the cooling unit 11. The semiconductor module 1 has a groove 1e to accommodate the outer periphery 2d of the Belleville washer 2 as with the second groove 1d in FIG. 3.

According to such a configuration, the Belleville washer 2 as a whole can substantially be brought closer to the semiconductor module 1, so that the height of the protrusion from the surface of the semiconductor module 1 can be suppressed.

Furthermore, stress to the Belleville washer 2 can be reduced to suppress inversion of the Belleville washer 2.

Modification of Embodiment 2

Figure 10:
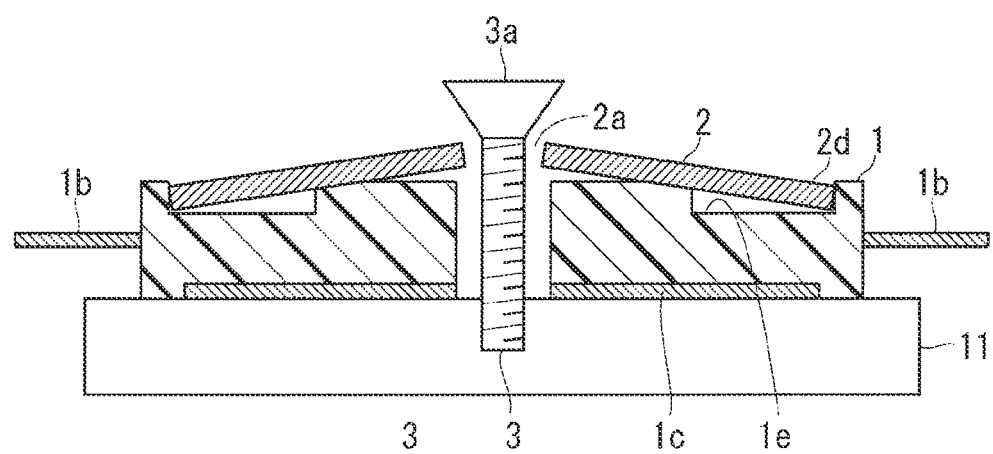
FIG. 10 is a cross-sectional view illustrating a configuration of a semiconductor device according to a modification of Embodiment 2.

In Embodiment 2, a periphery of the groove 1e may have a tapered shape to direct the outer periphery 2d of the Belleville washer into the groove 1e as illustrated in FIG. 10. According to such a configuration, the Belleville washer 2 as a whole can substantially be brought closer to the semiconductor module 1, so that the height of the protrusion from the surface of the semiconductor module 1 can be suppressed.

Figure 11:
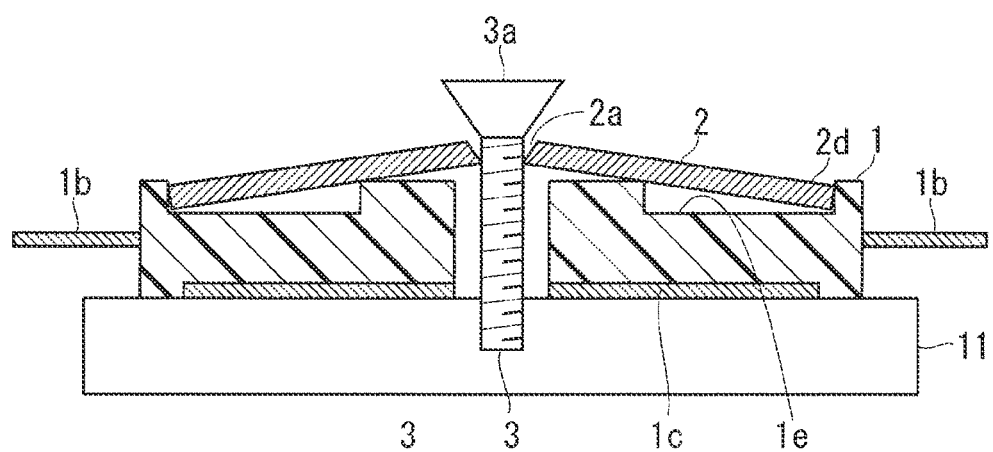
FIG. 11 is a cross-sectional view illustrating a configuration of the semiconductor device according to a modification of Embodiment 2.

The modifications of Embodiment 1 may be applied to Embodiment 2 and the like, and the modification of Embodiment 2 may be applied to Embodiment 1 and the like. For example, in Modification 2 (FIG. 3) of Embodiment 1, a periphery of the second groove 1d may have a tapered shape to direct the outer periphery 2d of the Belleville washer into the second groove 1d as in the modification (FIG. 10) of Embodiment 2. For example, in Embodiment 2, the hole 2a of the Belleville washer 2 may correspond in cross-sectional shape to at least portion of the head 3a of the screw 3 as illustrated in FIG. 11. As described above, a modification of each embodiment may be applied to another embodiment as appropriate, and the same applies to Embodiment 3 or later.

Embodiment 3

Figure 12:
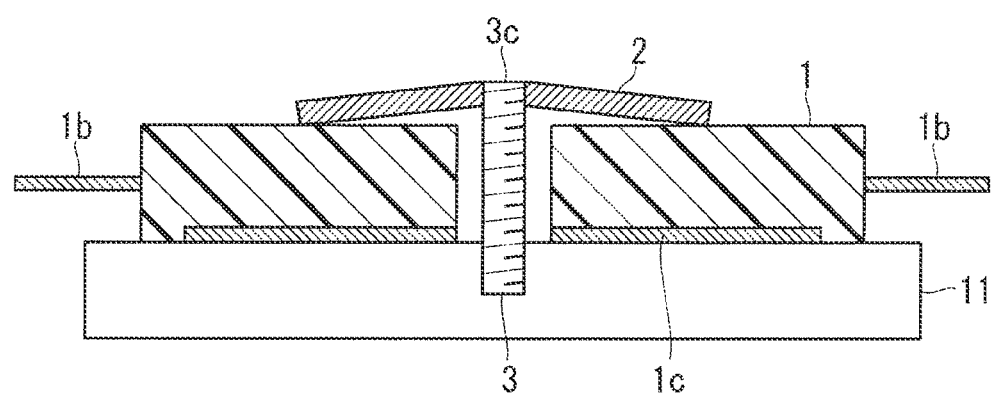
FIG. 12 is a cross-sectional view illustrating a configuration of a semiconductor device according to Embodiment 3.

FIG. 12 is a cross-sectional view illustrating a configuration of a semiconductor device according to Embodiment 3 of the present invention. In the following description, components according to Embodiment 3 that are the same as or similar to the above-mentioned components bear reference signs that are the same as or similar to those of the above-mentioned components, and description will be made mainly on different components.

In Embodiment 3, the screw 3 has a threaded portion 3c integrated with the Belleville washer 2 so as to fill the hole 2a of the Belleville washer 2 and fastens the semiconductor module 1 and the cooling unit 11. Such a configuration eliminates the need for the head 3a of the screw 3, so that the height of the protrusion from the surface of the semiconductor module 1 can be suppressed.

Embodiment 4

Figure 13:
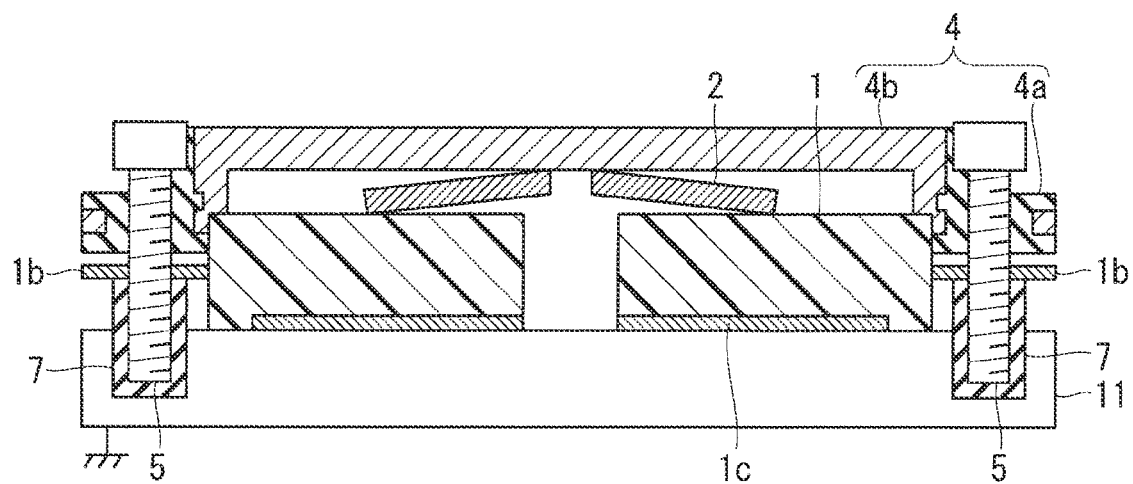
FIG. 13 is a cross-sectional view illustrating a configuration of a semiconductor device according to Embodiment 4.

FIG. 13 is a cross-sectional view illustrating a configuration of a semiconductor device according to Embodiment 4 of the present invention. In the following description, components according to Embodiment 4 that are the same as or similar to the above-mentioned components bear reference signs that are the same as or similar to those of the above-mentioned components, and description will be made mainly on different components.

The semiconductor device in FIG. 13 includes the semiconductor module 1, the Belleville washer 2, a cover 4, a screw 5, and an insulating terminal block 7, and the semiconductor module 1 is attached to the cooling unit 11 being the attached body with the screw 5. The cooling unit 11 is connected to a ground potential.

In Embodiment 4, the semiconductor module 1 has the electrode terminal 1b protruding laterally and a ground terminal, which is not illustrated, protruding laterally as with the electrode terminal 1b. The electrode terminal 1b is a main terminal for current-carrying other than the ground terminal, for example. In FIG. 13, the semiconductor module 1 has a hole similar to the hole through which the screw 3 in FIG. 1 passes, but the semiconductor module 1 may not have the hole.

In Embodiment 4, the Belleville washer 2 is a typical Belleville washer, does not have the recess 2b and the protrusion 2c in FIG. 1, and is disposed on an upper surface of the semiconductor module 1.

The cover 4 includes a first portion 4a and a second portion 4b. The first portion 4a opposes the electrode terminal 1b of the semiconductor module 1. The second portion 4b opposes the upper surface of the semiconductor module 1, and protrudes upward from the first portion 4a to accommodate the Belleville washer 2. The second portion 4b presses the Belleville washer 2 toward the semiconductor module 1.

In Embodiment 4, the first portion 4a is an insulating molding formed of an epoxy-based resin, for example, and the second portion 4b is a metal member, for example. According to such a configuration, even if the second portion 4b is electrically connected to the ground terminal of the semiconductor module 1, the insulating first portion 4a can insulate the electrode terminal 1b and the above-mentioned ground terminal.

The screw 5 fastens the first portion 4a of the cover 4, the electrode terminal 1b of the semiconductor module 1, and the cooling unit 11. According to such a configuration, the head of the screw and the Belleville washer do not overlap each other above the semiconductor module 1. The height of the protrusion from the surface of the semiconductor module 1 can thus be suppressed when the second portion 4b of the cover 4 has a thickness smaller than the height of the head of the screw. The screw 5 is threaded into the cooling unit 11 having the ground potential via the insulating terminal block 7. According to such a configuration, the insulating terminal block 7 can insulate the electrode terminal 1b and the cooling unit 11.

Modification 1 of Embodiment 4

In Embodiment 4, the first portion 4a and the second portion 4b of the cover 4 may be a single insulating molding formed of the epoxy-based resin, for example, as illustrated in FIG. 14. According to such a configuration, the structure of the cover 4 can be simplified.

Modification 2 of Embodiment 4

Figure 15:
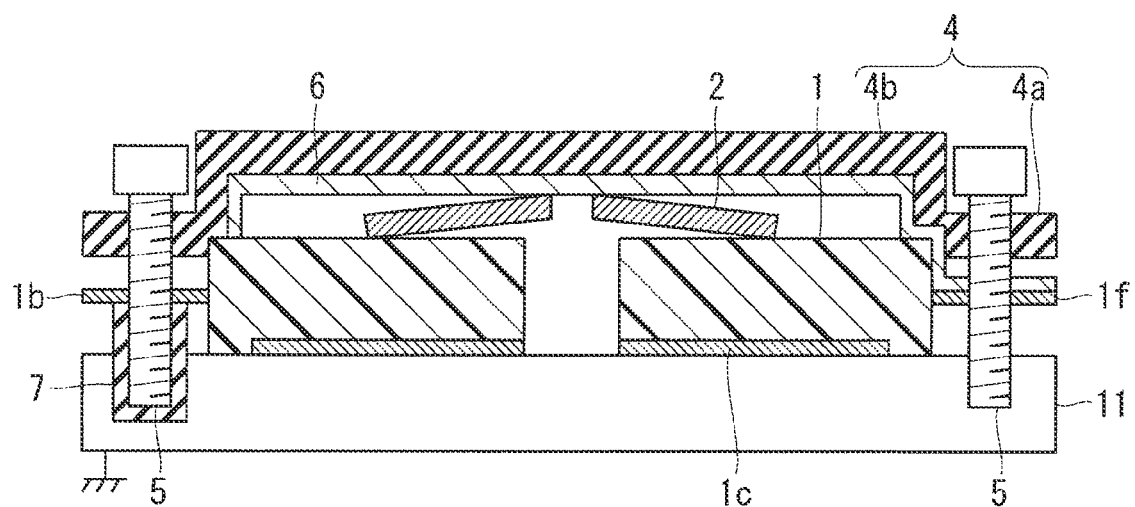
FIG. 15 is a cross-sectional view illustrating a configuration of a semiconductor device according to Modification 2 of Embodiment 4.

A semiconductor device according to Modification 2 in FIG. 15 has a ground terminal 1f in place of the electrode terminal 1b on a right side of the semiconductor device according to Modification 1 of Embodiment 4. As illustrated in FIG. 15, the semiconductor device may further include a metal plate 6 disposed on an inner surface of the cover 4 and being in contact with the ground terminal 1f of the semiconductor module 1. Examples of a material for the metal plate 6 include copper (Cu) and aluminum (Al). According to such a configuration, a shielding effect can be obtained. In an example of FIG. 15, the ground terminal 1f and the cooling unit 11 each have the ground potential, so that the screw 5 threaded into the metal plate 6 and the ground terminal 1f may directly be threaded into the cooling unit 11 not via the insulating terminal block 7.

Modification 3 of Embodiment 4

Figure 16:
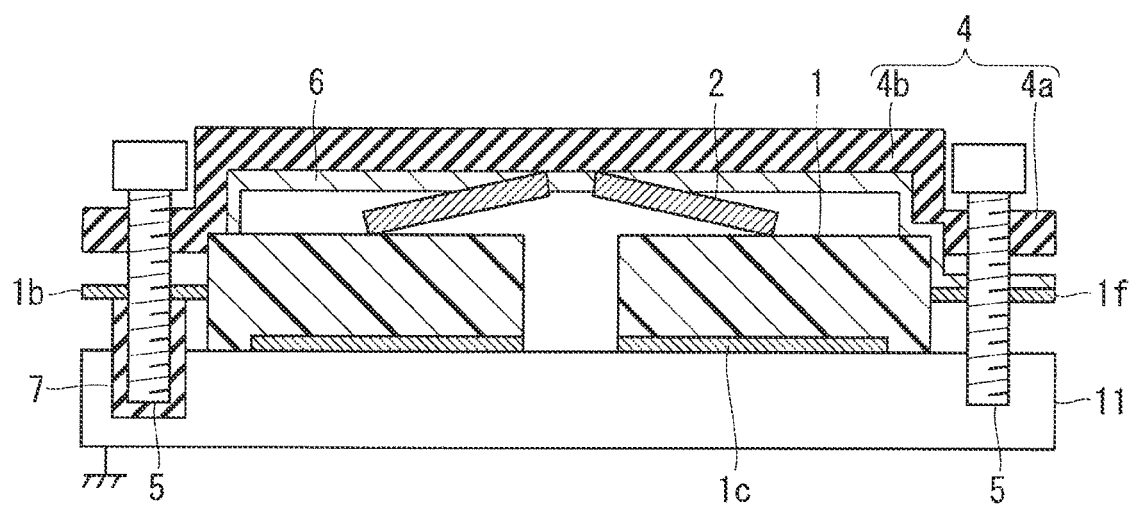
FIG. 16 is a cross-sectional view illustrating a configuration of a semiconductor device according to Modification 3 of Embodiment 4.

In Modification 2 of Embodiment 4, the cover 4 and the Belleville washer 2 may be integrated with each other as illustrated in FIG. 16. Such a configuration facilitates assembly of a press mechanism of the semiconductor device.

Modification 4 of Embodiment 4

Figure 17:
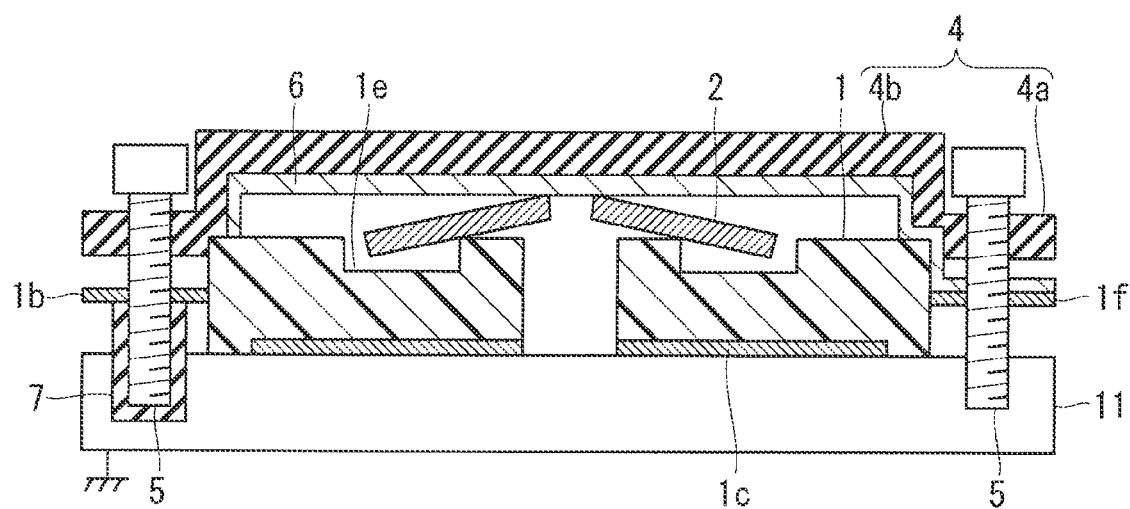
FIG. 17 is a cross-sectional view illustrating a configuration of a semiconductor device according to Modification 4 of Embodiment 4.

In Modification 2 of Embodiment 4, the semiconductor module 1 may have the groove 1e to accommodate the outer periphery 2d of the Belleville washer 2 as illustrated in FIG. 17. According to such a configuration, the height of the protrusion from the surface of the semiconductor module 1 can be suppressed, and inversion of the Belleville washer 2 can be suppressed as in Embodiment 2.

Although not illustrated, the periphery of the groove 1e may have a tapered shape to direct the outer periphery 2d of the Belleville washer into the groove 1e in the configuration of FIG. 17 as in the modification of Embodiment 2. According to such a configuration, the Belleville washer 2 as a whole can substantially be brought closer to the semiconductor module 1, so that the height of the protrusion from the surface of the semiconductor module 1 can be suppressed.

Embodiments and Modifications of the present invention can freely be combined with each other, and can be modified or omitted as appropriate within the scope of the invention.

While the invention has been described in detail, the foregoing description is in all aspects illustrative and not restrictive. It is therefore understood that numerous unillustrated modifications can be devised without departing from the scope of the invention.

EXPLANATION OF REFERENCE SIGNS 1 semiconductor module, 1a first groove, 1b electrode terminal, 1d second groove, 1e groove, 1f ground terminal, 2 Belleville washer, 2a hole, 2b recess, 2c protrusion, 2d outer periphery, 3, 5 screw, 3a head, 3b root, 3c threaded portion, 4 cover, 4a first portion, 4b second portion, 6 metal plate.

The invention claimed is:

1. A semiconductor device comprising:
a semiconductor module having a first groove;
a Belleville washer whose hole and a periphery of the hole are recessed to have a recess in an outer surface and a protrusion on an inner surface; and
a screw passing through the hole of the Belleville washer and the first groove of the semiconductor module to fasten the semiconductor module and an attached body, wherein
a head of the screw is accommodated in the recess of the Belleville washer, and
at least portion of the protrusion of the Belleville washer is accommodated in the first groove of the semiconductor module.

2. The semiconductor device according to claim 1, wherein
the first groove of the semiconductor module has a depth equal to or greater than a height of the protrusion of the Belleville washer.

3. The semiconductor device according to claim 1, wherein
the semiconductor module further has a second groove to accommodate an outer periphery of the Belleville washer.

4. The semiconductor device according to claim 3, wherein
the first groove and the second groove have different depths as long as the outer periphery of the Belleville washer is capable of pressing the semiconductor module.

5. The semiconductor device according to claim 1, wherein
the hole of the Belleville washer corresponds in cross-sectional shape to at least portion of a head of the screw.

6. The semiconductor device according to claim 5, wherein
the hole of the Belleville washer corresponds in cross-sectional shape to the head of the screw as a whole.

7. The semiconductor device according to claim 6, wherein
the hole of the Belleville washer corresponds in cross-sectional shape to the head of the screw as a whole and a root of the head of the screw.

8. The semiconductor device according to claim 1, wherein
the first groove of the semiconductor module corresponds in cross-sectional shape to at least portion of the protrusion of the Belleville washer.

9. The semiconductor device according to claim 8, wherein
a cross-sectional shape of the first groove of the semiconductor module includes a tapered shape.

10. A semiconductor device comprising:
a semiconductor module;
a Belleville washer; and
a screw passing through a hole of the Belleville washer to fasten the semiconductor module and an attached body, wherein
the semiconductor module has a groove to accommodate an outer periphery of the Belleville washer, the semiconductor module including an upper surface positioned inward of the groove, and
a lower surface of the Belleville washer is positioned partially above the upper surface of the semiconductor module.

11. The semiconductor device according to claim 10, wherein
a periphery of the groove has a tapered shape to direct the outer periphery of the Belleville washer into the groove.

12. The semiconductor device according to claim 10, wherein
a single screw passes through the Belleville washer.

13. A semiconductor device comprising:
a semiconductor module; and
a screw having a threaded portion integrated with a Belleville washer, and fastening the semiconductor module and an attached body.

14. The semiconductor device according to claim 13, wherein
the screw is headless.

15. A semiconductor device comprising:
a semiconductor module having an electrode terminal protruding laterally;
a Belleville washer disposed on an upper surface of the semiconductor module;
a cover including a first portion opposing the electrode terminal and a second portion opposing the upper surface and protruding upward from the first portion to accommodate the Belleville washer, the second portion pressing the Belleville washer toward the semiconductor module; and a screw to fasten the first portion of the cover, the electrode terminal of the semiconductor module, and an attached body.

16. The semiconductor device according to claim 15, wherein the first portion and the second portion of the cover are insulating.

17. The semiconductor device according to claim 15, wherein the semiconductor module has a ground terminal, and the semiconductor device further comprises a metal plate disposed on an inner surface of the cover, and being in contact with the ground terminal.

18. The semiconductor device according to claim 15, wherein the cover and the Belleville washer are integrated with each other.

19. The semiconductor device according to claim 18, wherein the semiconductor module has a groove to accommodate an outer periphery of the Belleville washer.

* * * * *